(12) United States Patent
Hoang et al.

(10) Patent No.: US 9,064,716 B2
(45) Date of Patent: Jun. 23, 2015

(54) STACKING DEVICES AT FINISHED PACKAGE LEVEL

(75) Inventors: Phan Hoang, Rancho Santa Margarita, CA (US); Chinh Minh Nguyen, Irvine, CA (US)

(73) Assignee: VIRTIUM TECHNOLOGY, INC., Rancho Santa Margarita, CA (US)

( * ) Notice: Subject to any disclaimer, the term of this patent is extended or adjusted under 35 U.S.C. 154(b) by 1438 days.

(21) Appl. No.: 12/571,313

(22) Filed: Sep. 30, 2009

(65) Prior Publication Data

US 2011/0074002 A1 Mar. 31, 2011

(51) Int. Cl.
*H01L 21/00* (2006.01)
*H01L 25/065* (2006.01)
*H01L 25/00* (2006.01)
*H01L 23/31* (2006.01)
*H01L 23/00* (2006.01)

(52) U.S. Cl.
CPC ............ *H01L 25/0657* (2013.01); *H01L 25/50* (2013.01); *H01L 23/3128* (2013.01); *H01L 24/16* (2013.01); *H01L 2224/16225* (2013.01); *H01L 2224/48091* (2013.01); *H01L 2224/48227* (2013.01); *H01L 2224/73253* (2013.01); *H01L 2225/0651* (2013.01); *H01L 2225/06517* (2013.01); *H01L 2225/0652* (2013.01); *H01L 2225/06527* (2013.01); *H01L 2225/06572* (2013.01); *H01L 2225/06596* (2013.01); *H01L 2924/14* (2013.01); *H01L 2924/15311* (2013.01); *H01L 2924/18161* (2013.01); *H01L 2924/19107* (2013.01)

(58) Field of Classification Search
CPC .............................. H01L 21/304; H01L 29/06
See application file for complete search history.

(56) References Cited

U.S. PATENT DOCUMENTS

| | | | | |
|---|---|---|---|---|
| 5,483,175 | A * | 1/1996 | Ahmad et al. | 438/18 |
| 5,923,954 | A * | 7/1999 | Cho | 438/108 |
| 6,060,373 | A * | 5/2000 | Saitoh | 438/459 |
| 6,459,152 | B1 * | 10/2002 | Tomita et al. | 257/738 |
| 6,506,681 | B2 * | 1/2003 | Grigg et al. | 438/692 |
| 6,558,977 | B2 * | 5/2003 | Nakaoka et al. | 438/107 |
| 6,582,991 | B1 * | 6/2003 | Maeda et al. | 438/107 |
| 6,630,685 | B1 * | 10/2003 | Lunde | 257/48 |
| 6,653,731 | B2 * | 11/2003 | Kato et al. | 257/737 |
| 6,774,467 | B2 * | 8/2004 | Horiuchi et al. | 257/673 |
| 6,870,248 | B1 * | 3/2005 | Shibata | 257/686 |
| 6,894,386 | B2 * | 5/2005 | Poo et al. | 257/730 |
| 6,900,072 | B2 * | 5/2005 | Patel et al. | 438/106 |
| 6,936,499 | B2 * | 8/2005 | Shibata et al. | 438/108 |
| 7,034,386 | B2 * | 4/2006 | Kurita | 257/685 |
| 7,041,578 | B2 * | 5/2006 | Mahle et al. | 438/462 |
| 7,094,630 | B2 * | 8/2006 | Tomita et al. | 438/108 |
| 7,129,110 | B1 * | 10/2006 | Shibata | 438/106 |
| 7,170,091 | B2 * | 1/2007 | Lunde | 257/48 |
| 7,192,870 | B2 * | 3/2007 | Shibata et al. | 438/692 |
| 7,272,273 | B2 * | 9/2007 | Yan et al. | 385/8 |
| 7,404,756 | B2 * | 7/2008 | Ouderkirk et al. | 451/57 |
| 7,412,639 | B2 * | 8/2008 | Volkerink et al. | 714/736 |
| 7,452,747 | B2 * | 11/2008 | Chan et al. | 438/106 |
| 7,556,983 | B2 * | 7/2009 | Kurita | 438/108 |
| 2001/0026010 | A1 * | 10/2001 | Horiuchi et al. | 257/678 |
| 2005/0087852 | A1 * | 4/2005 | Chen et al. | 257/686 |

(Continued)

*Primary Examiner* — David Zarneke

(57) ABSTRACT

An embodiment is a method and apparatus to stack devices. A first finished package level (FPL) device having a first grounded tested die (GTD) is reduced to nearly size of the first GTD. The first FPL has a first plurality of solder balls. The reduced first FPL device is attached to a first substrate to form a first device assembly.

10 Claims, 7 Drawing Sheets

(56) References Cited

U.S. PATENT DOCUMENTS

| | | | |
|---|---|---|---|
| 2009/0160065 A1* | 6/2009 | Haba et al. | 257/777 |
| 2010/0065949 A1* | 3/2010 | Thies et al. | 257/621 |
| 2011/0049694 A1* | 3/2011 | Chandrasekaran et al. | 257/686 |
| 2011/0049695 A1* | 3/2011 | Shin et al. | 257/686 |
| 2014/0248730 A1* | 9/2014 | Huang et al. | 438/50 |

* cited by examiner

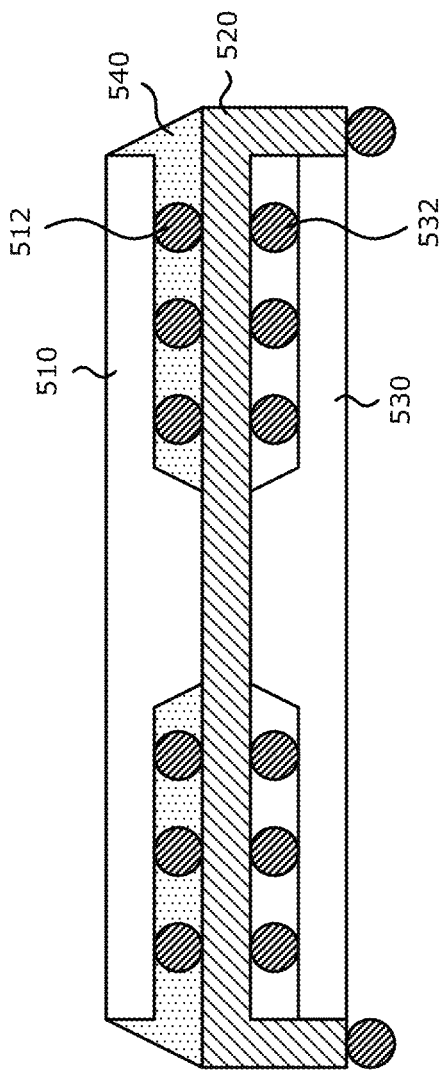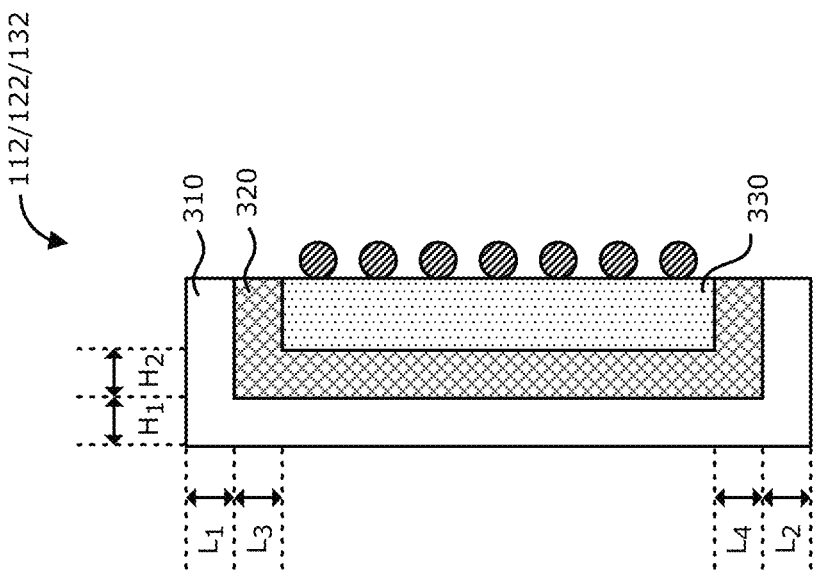

STACKING DEVICES AT FINISHED PACKAGE LEVEL

TECHNICAL FIELD

The presently disclosed embodiments are directed to the field of integrated circuits, and more specifically, to packaging.

BACKGROUND

With the popularity of compact processor systems such as handheld devices, laptop computers, mobile phones, and smart cards, demands for small footprint and form factor for integrated circuits have created challenging opportunities for packaging engineers.

To reduced footprint, devices may be stacked on each other. One technique is to stack integrated circuits at the die level. Multiple dice are stacked on top of one another during the packaging process. This technique requires expensive equipment and extensive die testing steps.

SUMMARY

One disclosed feature of the embodiments is a method and apparatus to stack devices. A first finished package level (FPL) device having a first grounded tested die (GTD) is reduced to nearly size of the first GTD. The first FPL has a first plurality of solder balls. The reduced first FPL device is attached to a first substrate to form a first device assembly.

BRIEF DESCRIPTION OF THE DRAWINGS

Embodiments may best be understood by referring to the following description and accompanying drawings that are used to illustrate embodiments. In the drawings.

FIG. 4 is a diagram illustrating a side view of a reduced finished package level (FPL) device according to one embodiment.

FIG. 5 is a diagram illustrating a tSTACK configuration according to one embodiment.

DETAILED DESCRIPTION

Figure 1:
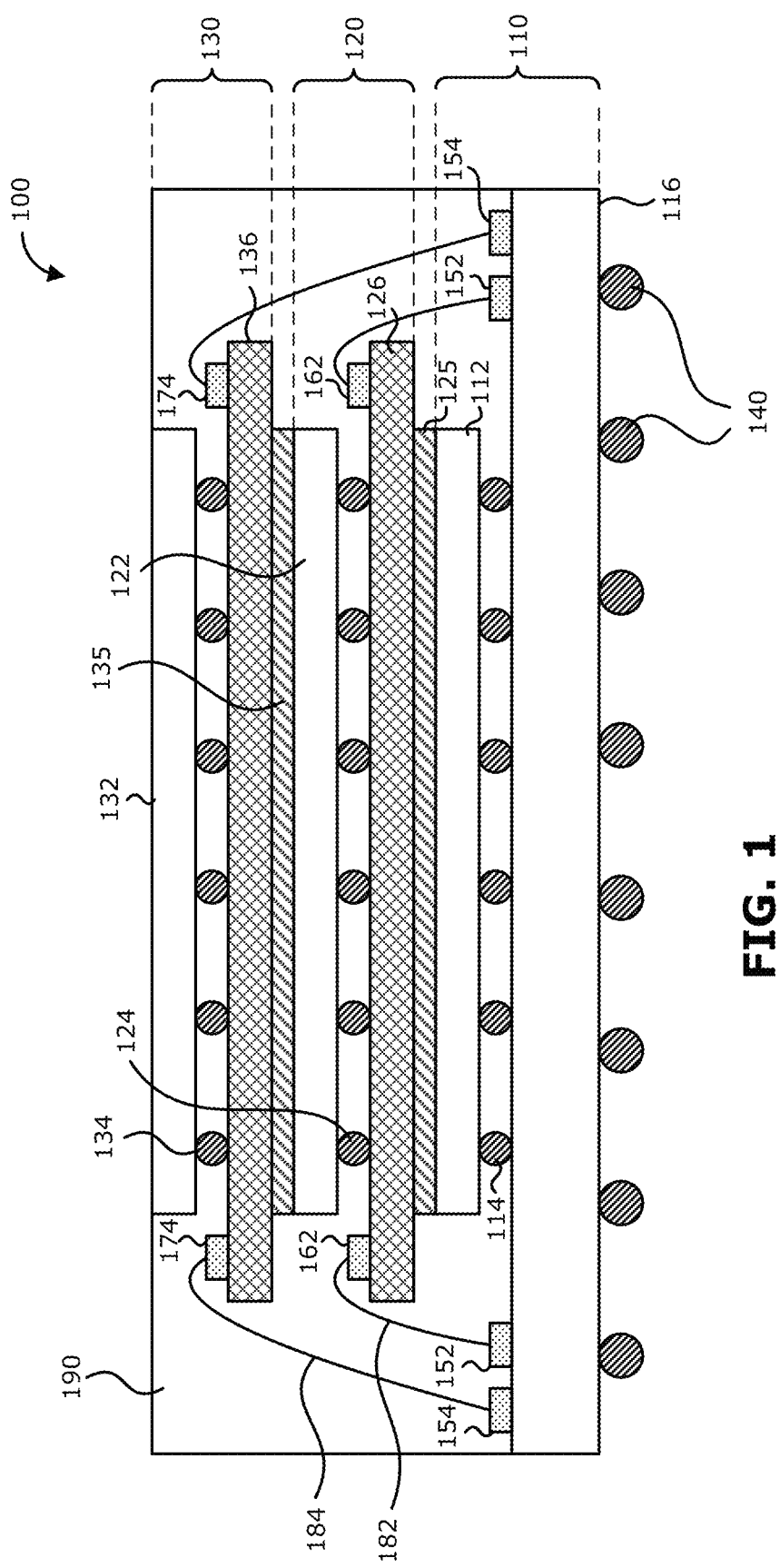
FIG. 1 is a diagram illustrating a package assembly according to one embodiment.

One disclosed feature of the embodiments is a technique to stack devices. A first finished package level (FPL) device having a first grounded tested die (GTD) is reduced to nearly size of the first GTD. The first FPL has a first plurality of solder balls. The reduced first FPL device is attached to a first substrate to form a first device assembly.

In the following description, numerous specific details are set forth. However, it is understood that embodiments may be practiced without these specific details. In other instances, well-known circuits, structures, and techniques have not been shown to avoid obscuring the understanding of this description.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a technique to stack devices. A first finished package level (FPL) device having a first grounded tested die (GTD) is reduced to nearly size of the first GTD. The first FPL has a first plurality of solder balls. The reduced first FPL device is attached to a first substrate to form a first device assembly. The left and right sides of the first FPL device are ground to nearly the size of the first GTD. The top surface of the first FPL device is ground such that the thickness of the first FPL device is reduced to a pre-determined thickness. The attaching may be performed by a standard surface mount reflow process. A solder paste is applied to the first substrate and the solder paste is reflowed. The reduced first FPL device may be attached to the top surface of the first substrate or be seated into the first substrate having clearing holes that fit the first plurality of solder balls such that the solder balls are inserted into the clearing holes.

In one embodiment, referred to as cSTACK configuration, a second device assembly with similar structure as the first device assembly may be stacked on the first device assembly. One or more similar device assemblies may be stacked on the second device assembly to form a stacked package assembly.

In another embodiment, referred to as a tSTACK configuration, the first substrate is stepped to a predetermined thickness and the reduced first FPL device is attached to top surface of the stepped first substrate. A reduced second FPL device has a second plurality of solder balls and a second GTD. The reduced second FPL device is reduced to nearly size of the second GTD. It is flipped over and attached to bottom surface of the stepped first substrate. The reduced first FPL device may be encapsulated with mold.

The advantages of various embodiments include compact package of stacked devices, high mechanical strength, inexpensive manufacturing costs, and high reliability.

FIG. 1 is a diagram illustrating a package assembly 100 according to one embodiment. The package assembly 100 includes a first device assembly 110, a second device assembly 120, a third device assembly 130, and an encapsulant 190. The package assembly 100 may include more or less than the above components. For example, it may include only one or two device assemblies with or without encapsulant, or more than three device assemblies with or without encapsulant.

The first device assembly 110 includes a reduced first finished package level (FPL) device 112 and a first substrate 116. The first FPL device 112 has a first grounded tested device (GTD) and a first plurality of solder balls 114. The reduced first FPL device is reduced to nearly size of the first GTD. The first substrate 116 is attached to the reduced first FPL device 112 by a reflowed solder paste to form the first device assembly 110. The first substrate 116 may have solder balls 140 attached at the bottom surface so that the package assembly 100 may be attached to a printed circuit board (PCB) or to other device(s) or component(s).

The second device assembly 120 includes a reduced second FPL device 122 and a second substrate 126. The second FPL device 122 has a second GTD and a second plurality of solder balls 124. The reduced second FPL device 122 is reduced to nearly size of the second GTD. The second substrate 126 is attached to the reduced second FPL device 122 by a reflowed solder paste to form the second device assembly 120. Similarly, the third device assembly 130 includes a reduced third FPL device 132 and a third substrate 136. The third FPL device 132 has a third GTD and a third plurality of solder balls 134. The reduced third FPL device 132 is reduced to nearly size of the third GTD. The third substrate 136 is attached to the reduced third FPL device 132 by a reflowed solder paste to form the third device assembly 130.

It is noted that in each of the device assemblies 110, 120, and 130, the number of reduced FPL devices may be more than one. For illustrative purposes, only one reduced FPL device is shown for each of the device assemblies 110, 120, and 130. Any one of the first, second, and third FPL devices may be a device having a ball grid array (BGA) package.

Typically, the first substrate 116 is the main substrate. Its size may be larger than the size of the second substrate 126 and the third substrate 136. It may have bonding pads 152 and 154. The second and third substrates 126 and 136 may have bonding pads 162 and 174, respectively. The bonding pads are connection points to traces in the substrates that are electrical connections for the circuits in the corresponding FPL devices. They are provided to allow bond wires 182 and 184 to be connected between the first substrate 116 and the second and third substrates 126 and 136 so that devices in the device assemblies 110, 120, and 130 may be electrically connected.

The device assemblies 110, 120, and 130 may be encapsulated by the encapsulant 190. The encapsulant 190 may be any suitable encapsulant for device package, such as epoxy with low viscosity and low coefficient of thermal expansion (CTE). In one embodiment, the encapsulant 190 may include a flow control barrier, or dam, material and a fill material. Examples of the dam material may include the Hysol® product line (e.g., FP4451) manufactured by Henkel, Germany. Examples of the fill material may include the Hysol® product line (e.g., FP4652) manufactured by Henkel, Germany.

The reduced FPL devices 112/122/132 may be attached to the corresponding substrate 116/126/136 by normal surface mount soldering technology where the solder balls are reflowed to attach to the surface of the substrate. Alternatively, the reduced FPL devices 112/122/132 may be attached to the corresponding substrate 116/126/136 using through-hole substrate. Typically, the through-hole configuration may be available to the second and third device assemblies 120 and 130. However, it may be possible for the first device assembly 110 to have this option.

Figure 2:
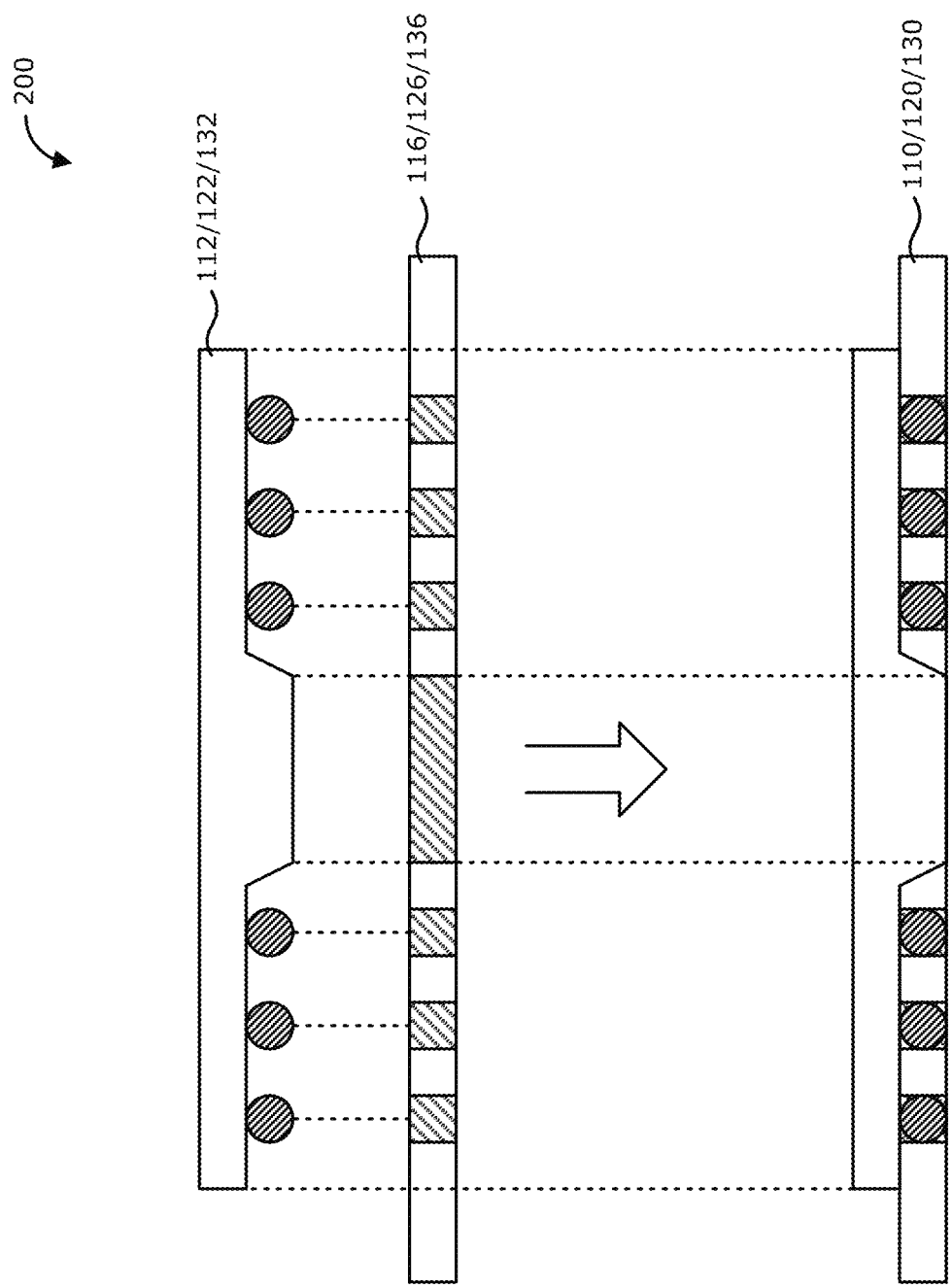
FIG. 2 is a diagram illustrating a device assembly with through-hole substrate according to one embodiment.

FIG. 2 is a diagram illustrating a device assembly with through-hole substrate according to one embodiment.

The device 112/122/132 is the reduced FPL device that has been thinned and size-reduced. The substrate 116/126/136 has clearing holes, or trenches, that fit the first/second/third plurality of solder balls such that the solder balls are inserted into the clearing holes. The substrate 116/126/136 may also have additional holes, or trenches, to accommodate other protruding portions of the reduced FPL device 112/122/132, such as the base portion at the center of the reduced FPL device 112/122/132.

When the reduced FPL device 112/122/132 is seated on top of the corresponding substrate 116/126/136, the associated solder balls are inserted into, and embedded within, the substrate 116/126/136. The result is that the total height of the device assembly 110/120/130 is equal to the sum of the thickness of the reduced FPL device 112/122/132 (without the height of solder balls or other protruding portions) and the substrate thickness. This leads to a much thinner device assembly than the normal surface mount attachment.

The holes in the substrate 116/126/136 may be through-holes or openings (i.e., the substrate is perforated at the hole locations) or hollow holes (i.e., the substrate is etched to have cavities, trenches) with sufficient depth and suitable shape (e.g., partially spherical) to accommodate the solder balls or any other protruding portions of the reduced FPL device 112/122/132. Whether the holes are through-holes or trenches, the solder balls 114/124/134 may be fully or partially inserted into the holes.

Typically, the first substrate 116, being the main substrate of the package assembly, may not use the through-hole configuration because the mechanical strength may be weakened or there may be electrical interferences with the solder balls 140. However, if the first substrate 116 has sufficient thickness, it may have trenches with depths to accommodate the solder balls 114. The solder balls 114 or any other protruding portions of the reduced FPL device 112 may be fully or partially inserted into, or embedded within, the first substrate 116. Furthermore, if there are no mechanical or electrical problems, the first substrate 116 may have through-hole configuration.

Figure 3:
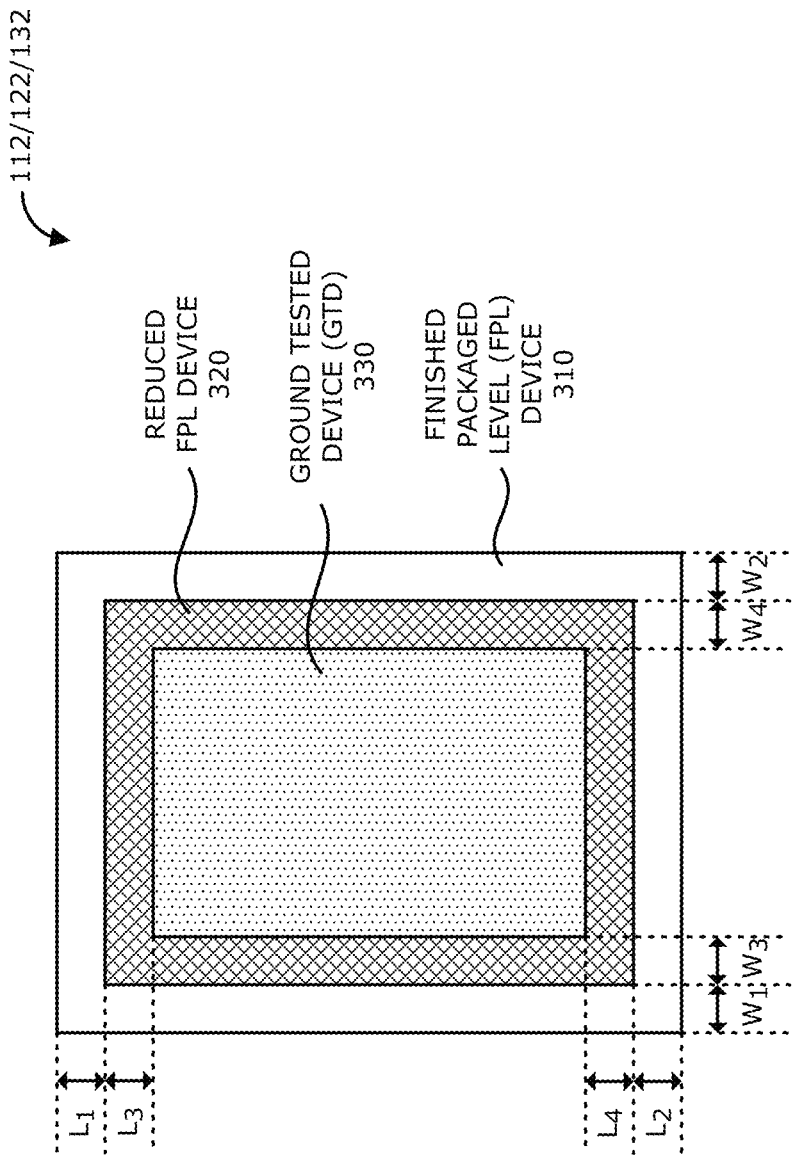
FIG. 3 is a diagram illustrating a top view of a reduced finished package level (FPL) device according to one embodiment.

FIG. 3 is a diagram illustrating a top view of the reduced finished package level (FPL) device 112/122/132 according to one embodiment.

The reduced FPL device 112/122/132 may be obtained by cutting off portions of the corresponding FPL device. An FPL device 310 is a device that has been tested and packaged by the integrated circuit (IC) manufacturer. Since it is a finished product, the FPL device 310 typically has gone through extensive testing processes at the manufacturing facilities. The FPL device 310 has a ground tested die (GTD) 330.

The FPL device 310 is ground, milled, sawed, or cut off such that the resulting reduced FPL device 320 (corresponding to the reduced FPL device 112/122/132) has a size that is close to, or nearly close to, the size of the GTD 330. The grinding may be performed using wafer grinding equipment, milling machine, or any other suitable process.

The portions to be ground or cut off may include any suitable portions. In one embodiment, these may include the left and right sides, the top and bottom sides, and the top surface of the device. FIG. 3 shows the top view. For the top view, the left and right sides and the top and bottom sides may be ground to nearly the size of the GTD 330.

The FPL device 310 may be ground to reduce the width by cutting off portions $W_1$ and $W_2$, corresponding to the left and right sides, respectively. It may also be ground to reduce the length by cutting off portions $L_1$ and $L_2$, corresponding to the top and bottom sides. After the size reduction, the reduced FPL device 320 has a size very close to the size of the GTD 330. Its width may be $W_3$ and $W_4$ away from the left and right sides, respectively, of the GTD 330 and its length may be $L_3$ and $L_4$ away from the top and bottom sides, respectively, of the GTD 330.

The amounts of cut-off, i.e., the values of $W_1$, $W_2$, $L_1$ and $L_2$, depend on the particular FPL device and the corresponding GTD, and the level of desired reduction. In one embodiment, $W_1$ and $W_2$ may be between 5% to 15% of the overall width of the FPL device 310.

FIG. 4 is a diagram illustrating a side view of the reduced FPL device 112/122/132 according to one embodiment.

In addition to the side portions, the FPL device 310 may also be thinned by having the top surface ground or cut off. The FPL device 310 may be ground to remove a thickness of $H_1$ on the top surface. The resulting reduced FPL device 320 may have a top surface at a distance of $H_2$ from the top surface of the GTD 330.

The amount of grinding depends on the particular FPL device and the level of desired thickness. In one embodiment, $H_1$ may be between 30% to 50% of the overall thickness of the FPL device 310.

FIG. 5 is a diagram illustrating a package assembly using a tSTACK configuration according to one embodiment. The package assembly shown in FIG. 5 includes a reduced first FPL device 510, a substrate 520, a reduced second FPL device 530, and encapsulant 540. The package assembly may include more or less than the above components. For example, one or more device assemblies may be stacked on the reduced first FPL device 510. A device assembly may include a reduced FPL device attached to a substrate.

The reduced first and second FPL devices 510 and 530 may be FPL devices that have been reduced in a similar manner as described in FIGS. 3 and 4.

The reduced first FPL device 510 has a first plurality of solder balls 512 and a first GTD. The reduced first FPL device is reduced to nearly size of the first GTD. It is attached to top surface of the substrate 520. The attaching may be performed by normal surface mount soldering process. The substrate 520 may be stepped to a predetermined thickness. The stepped substrate 520 has a cavity, a trench or a hollow region, at the bottom surface. The reduced second FPL device 530 has a second plurality of solder balls 532 and a second GTD. The reduced second FPL device is reduced to nearly size of the second GTD. It is flipped over and attached to bottom surface of the stepped first substrate 520 within the hollow region. The reduced first FPL device 510 may be encapsulated with encapsulant 540. The encapsulant 540 may be any suitable encapsulant similar to the encapsulant 190 shown in FIG. 1.

Figure 6:
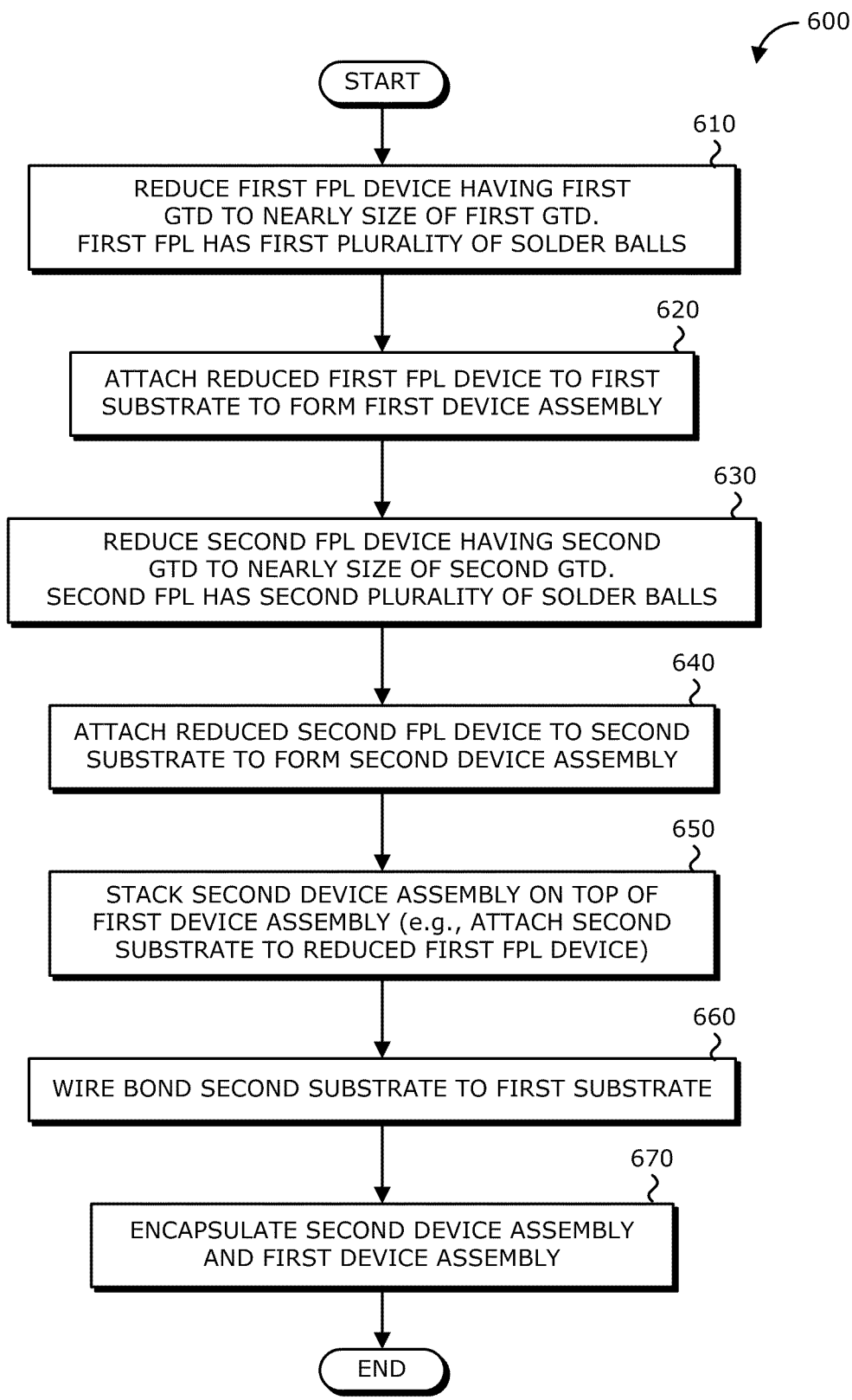
FIG. 6 is a flowchart illustrating a process to construct a package assembly according to one embodiment.

FIG. 6 is a flowchart illustrating a process 600 to construct a package assembly according to one embodiment.

Upon START, the process 600 reduces a first FPL device having a first GTD to nearly size of the first GTD. The first FPL has a first plurality of solder balls (Block 610). Then, the process 600 attaches the reduced first FPL device to a first substrate to form a first device assembly (Block 620). Next, the process 600 reduces a second FPL device having a second GTD to nearly size of the second GTD (Block 630). The second FPL has a second plurality of solder balls. Then, the process 600 attaches the reduced second FPL device to a second substrate to form a second device assembly (Block 640). Next, the process 600 stacks the second device assembly on top of the first device assembly (Block 650). This may be performed by attaching the second substrate to the reduced first FPL device (e.g., using adhesive to bond the bottom surface of the second substrate to the top surface of the reduced first FPL device).

Then, the process 600 wire bonds the second substrate to the first substrate (Block 660). This may be performed by wire bonding the bond pads on the second substrate to the bond pads on the first substrate. Next, the process 600 encapsulates the second device assembly and the first device assembly (Block 670). The process 600 is then terminated.

It is noted that the process 600 illustrates stacking a second device assembly on top of a first assembly. One or more device assemblies may be stacked in a similar manner.

Figure 7:
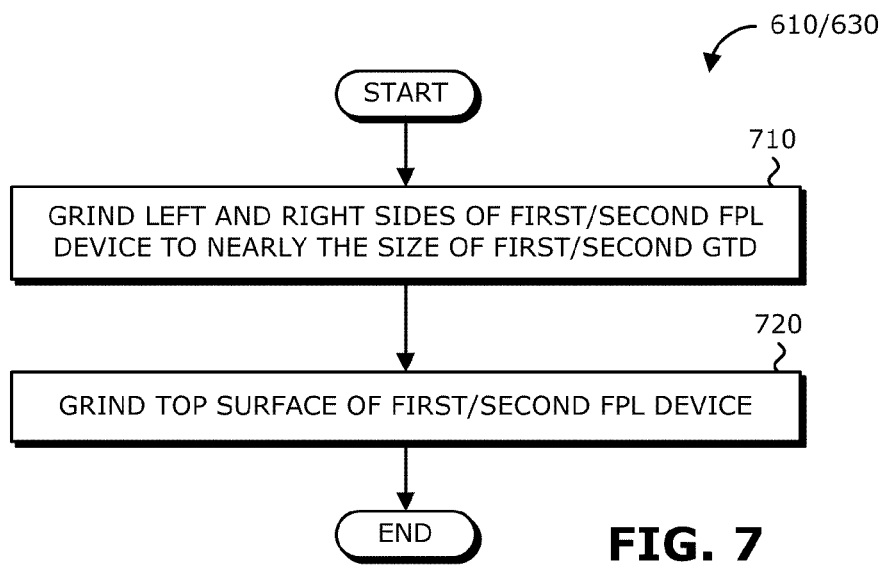
FIG. 7 is a flowchart illustrating a process to reduce a finished package level (FPL) device according to one embodiment.

FIG. 7 is a flowchart illustrating the process 610/620 to reduce a finished package level (FPL) device according to one embodiment.

Upon START, the process 610/620 grinds, mills, or cuts off, left and right sides of the first/second FPL device to nearly the size of the first/second GTD (Block 710). As discussed above, the amount of portion to be ground or cut off depends on the FPL device and the GTD. Next, the process 610/620 grinds top surface of the first FPL device to reduce the thickness (Block 720). The process 610/620 is then terminated.

Figure 8:
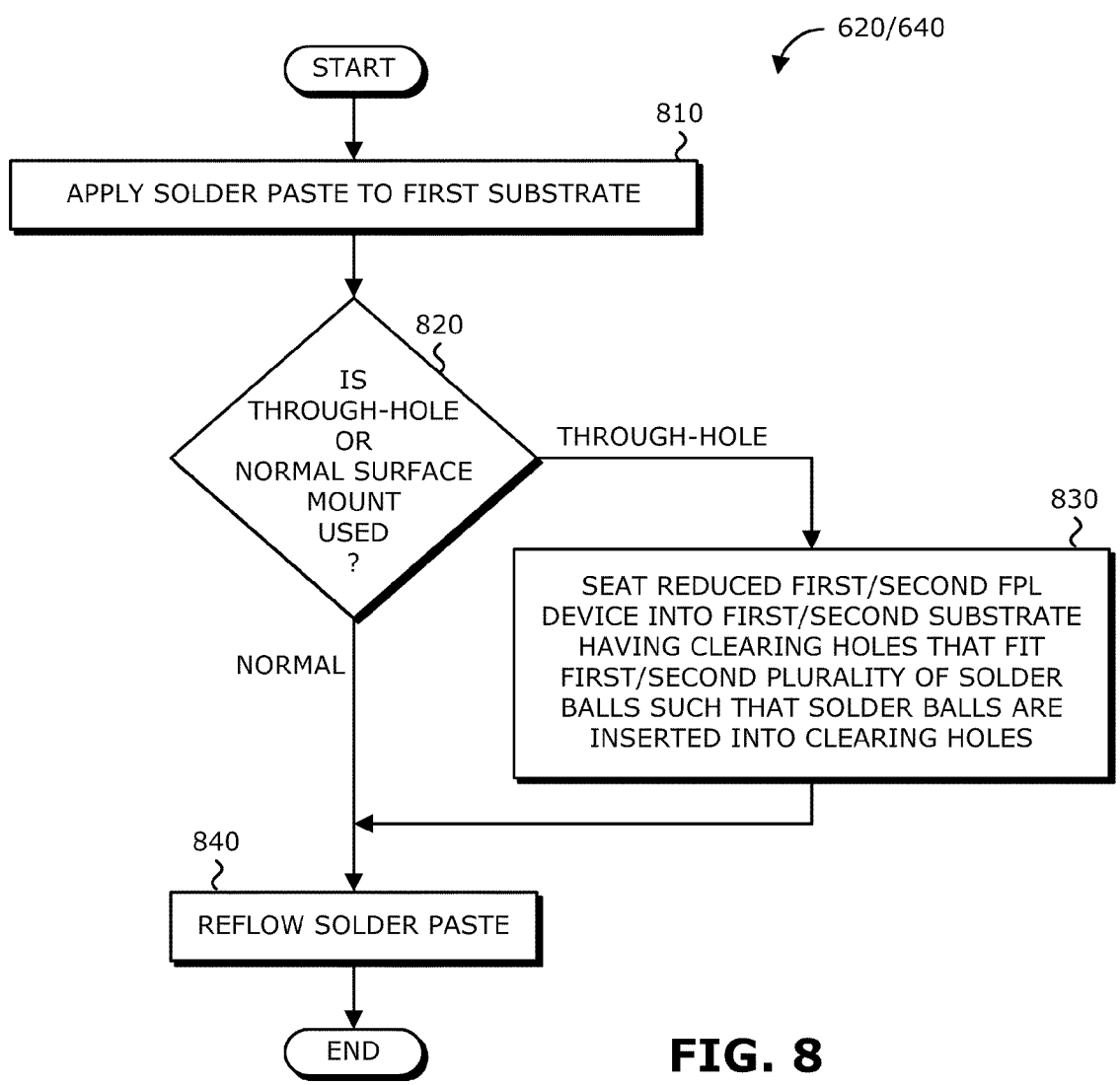
FIG. 8 is a flowchart illustrating a process to attach a reduced FPL device to a substrate according to one embodiment.

FIG. 8 is a flowchart illustrating the process 620/640 to attach a reduced FPL device to a substrate according to one embodiment.

Upon START, the process 620/640 applies a solder paste to the first/second substrate (Block 810). The solder paste may contain an appropriate amount of solder and flux. Next, the process 620/640 determines if the through-hole or normal surface mount attachment is used (Block 820). If it is the through-hole, the process 620/640 seats the reduced first/second FPL device into the first/second substrate having clearing holes that fit the first/second plurality of solder balls such that the solder balls are inserted into the clearing holes (Block 830). Then, the process 620/640 proceeds to Block 840. If it is the normal surface mount attachment, the process 620/640 reflows the solder paste (Block 840). The process 620/640 is then terminated.

Figure 9:
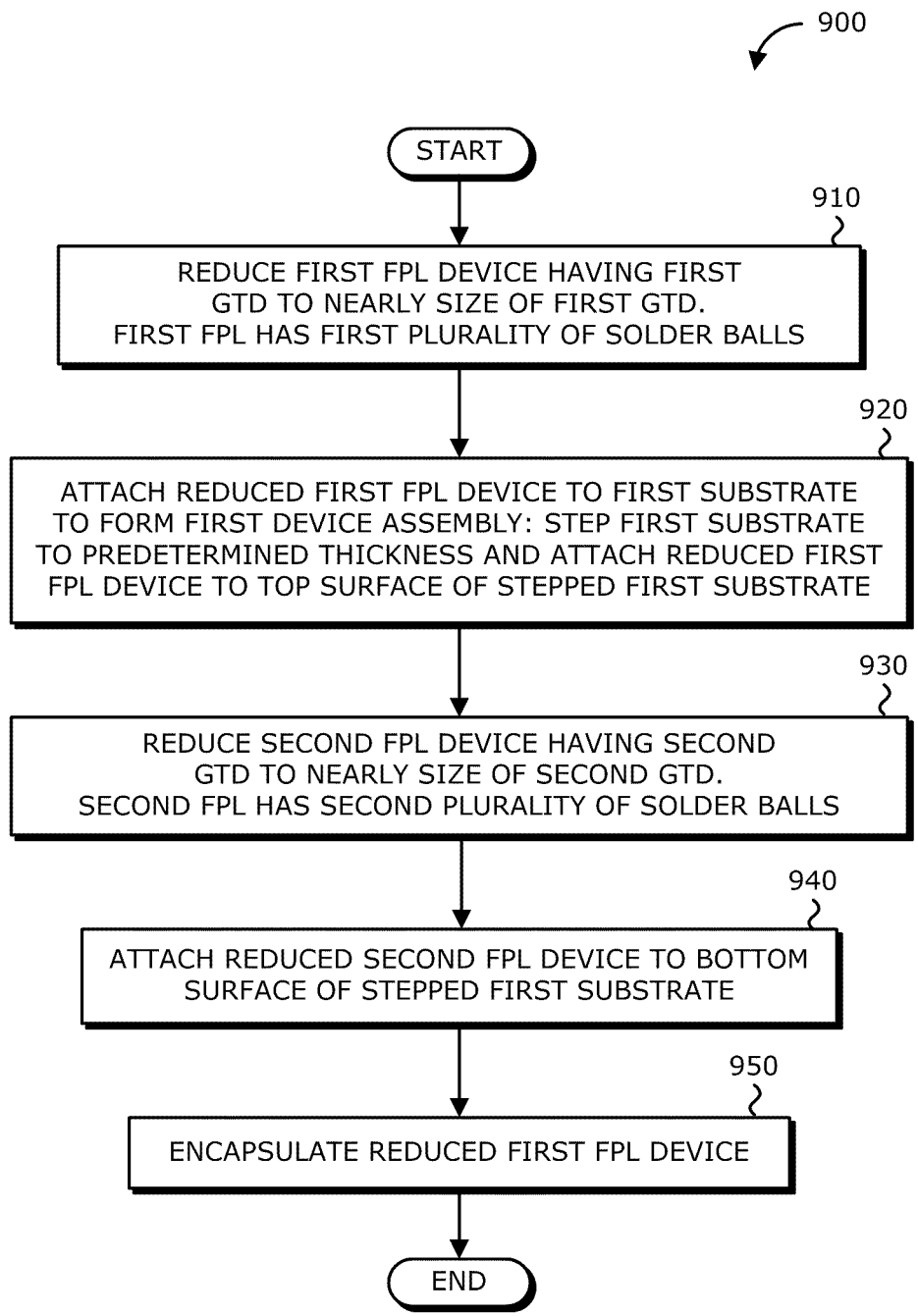
FIG. 9 is a flowchart illustrating a process to stack devices in a tSTACK configuration according to one embodiment.

FIG. 9 is a flowchart illustrating a process 900 to stack devices in tSTACK according to one embodiment.

Upon START, the process 900 reduces a first FPL device having a first GTD to nearly size of the first GTD (Block 910). Note that this operation is similar to Block 610 shown in FIG. 7. The first FPL has a first plurality of solder balls. Then, the process 900 attaches the reduced first FPL device to a first substrate to form a first device assembly (Block 920). This may be performed by stepping the first substrate to a predetermined thickness such that the stepped first substrate has a cavity, and attaching the reduced first FPL device to top surface of the stepped first substrate.

Next, the process 900 reduces a second FPL device having a second GTD to nearly size of the second GTD (Block 930). The second FPL has a second plurality of solder balls. Note that this operation is similar to Block 630 shown in FIG. 7. Then, the process 900 attaches the reduced second FPL device to bottom surface of the stepped first substrate into the cavity (Block 940). Next, the process 900 encapsulates the reduced first FPL device (Block 950). The process 900 is then terminated.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method comprising:
    reducing a first finished package level (FPL) device having a first grounded tested die (GTD) to nearly size of the first GTD, the first FPL having a first plurality of solder balls; and
    attaching the reduced first FPL device to a first substrate to form a first device assembly,
    wherein the first FPL being a device that is previously tested and packaged by an IC manufacturer.

2. The method of claim 1 wherein reducing comprises:
grinding left and right sides of the first FPL device to nearly the size of the first GTD; and
grinding top surface of the first FPL device.

3. The method of claim 1 wherein attaching comprises:
applying a solder paste to the first substrate; and
reflowing the solder paste.

4. The method of claim 3 wherein attaching further comprises:
seating the reduced first FPL device into the first substrate having clearing holes that fit the first plurality of solder balls such that the solder balls are inserted into the clearing holes.

5. The method of claim 1 further comprising:
reducing a second FPL device having a second GTD to nearly size of the second GTD, the second FPL having a second plurality of solder balls;
attaching the reduced second FPL device to a second substrate to form a second device assembly; and
stacking the second device assembly on top of the first device assembly.

6. The method of claim 5 wherein stacking comprises:
attaching the second substrate to the reduced first FPL device.

7. The method of claim 5 further comprising:
wire bonding the second substrate to the first substrate; and
encapsulating the second device assembly and the first device assembly.

8. The method of claim 1 wherein attaching the reduced first FPL device to the first substrate comprises:
stepping the first substrate to a predetermined thickness, the stepped first substrate having a cavity; and
attaching the reduced first FPL device to top surface of the stepped first substrate.

9. The method of claim 8 further comprising:
reducing a second FPL device having a second GTD to nearly size of the second GTD, the second FPL having a second plurality of solder balls;
attaching the reduced second FPL device to bottom surface of the stepped first substrate into the cavity; and
encapsulating the reduced first FPL device.

10. The method of claim 1 wherein the first FPL device is a ball grid array (BGA) device.

\* \* \* \* \*